United States Patent
Kao

[11] Patent Number: 5,973,517
[45] Date of Patent: Oct. 26, 1999

[54] SPEED-ENHANCING COMPARATOR WITH CASCADED INVENTORS

[75] Inventor: Hsueh-Wu Kao, Hsinchu Hsien, Taiwan

[73] Assignee: Industrial Technology Research Institute, Hsinchu, Taiwan

[21] Appl. No.: 09/086,248

[22] Filed: May 28, 1998

[51] Int. Cl.$^6$ .................................................. H03K 5/153
[52] U.S. Cl. ................................ 327/77; 327/337; 327/93
[58] Field of Search .................................. 327/77, 91, 93, 327/94, 95, 96, 337, 374; 330/9

[56] References Cited

U.S. PATENT DOCUMENTS

| | | | |
|---|---|---|---|
| 4,523,107 | 6/1985 | Peterson | 327/95 |
| 4,695,748 | 9/1987 | Kumamoto | 327/85 |
| 4,816,701 | 3/1989 | Ando et al. | 327/77 |
| 5,010,338 | 4/1991 | Miki et al. | 327/63 |
| 5,262,686 | 11/1993 | Kurosawa | 327/77 |
| 5,397,936 | 3/1995 | Wang | 327/77 |

*Primary Examiner*—Toan Tran
*Attorney, Agent, or Firm*—Harness, Dickey & Pierce, P.L.C.

[57] ABSTRACT

A speed-enhancing comparator with cascaded inverters is disclosed. The comparator comprises: a first capacitor, a first inverter, and a first switch, wherein the first switch and the first inverter are connected in parallel, and a first terminal of the first capacitor is coupled to an input terminal of the first inverter; a first input switch and a second input switch, wherein input terminals of the first and second input switches are coupled to an input voltage and a reference voltage respectively, and both output terminals of the first and second input switches are coupled to a second terminal of the first capacitor; a second inverter, a second switch, and a third switch, wherein the second inverter and the third switch are connected in series and then connected in parallel with the second switch, and an output terminal of the first inverter is coupled to an input terminal of the second inverter; and a second capacitor, a third inverter, and a fourth switch, wherein the fourth switch and third inverter are connected in parallel, and a first terminal of the second capacitor is coupled to an input terminal of the third inverter, and a second terminal of the second capacitor is coupled to both output terminals of the second and third switches. The first to fourth switches and the first and second input switches carry out on/off operations, whereby the third inverter outputs a comparing result of the input voltage and the reference voltage.

2 Claims, 4 Drawing Sheets

SPEED-ENHANCING COMPARATOR WITH CASCADED INVENTORS

BACKGROUND OF THE INVENTION

1. Field of the Invention

The present invention relates in general to a comparator. More specifically, it relates to a comparator utilizing a plurality of inverters, connected in series, and a plurality of switches to enhance its operation speed.

2. Description of the Related Art

At present, most electronic systems use powerful microprocessors to process digitized data. Analog-to-digital converters, ADC hereinafter, serve a critical role in digitalization as interface media between analog signals and digital signals.

In general, either parallel-connected converters or flash converters are utilized to implement ADC converters, both of which output binary codes from an encoder after an analog signal is sampled and its voltage level compared with several reference voltage levels. An outputted binary code corresponds to the reference voltage level closest to the voltage level of the analog signal.

A flash ADC usually requires a large number of comparators for implementation. In order to simplify the design of the ADC in high-resolution applications, an ADC using a plurality of transforming stages for reducing the number of comparators has been proposed. For example, two-step analog-to-digital converters are commonly used for transforming analog input voltage into a digital code. The two-step ADC will first roughly determine the voltage range closest to the input voltage, thereby obtaining a high-bit portion (MSB) of the digital code. The two-step ADC will then further subdivide the closest voltage range determined above and compare the input voltage therein, thereby obtaining a low-bit portion (LSB) of the digital code.

In general, a two-step ADC uses comparators of the inverter type for obtaining both the high-bit portion (MSB) of the digital code and the low-bit portion (LSB) of the digital code. However, the signal (or voltage level) used for comparing to obtain the low-bit portion (LSB) of the digital code is usually small, and therefore the output voltage of the comparator requires a longer time to reach its steady state, thus resulting in a reduction and limitation of the converting speed of the ADC. When the resolution of an ADC is enhanced, the signal used for obtaining the low-bit portion (LSB) of the digital code becomes even smaller, thereby even further reducing the converting speed of the ADC.

FIG. 1A and FIG. 1B illustrate the structure of a conventional comparator and the timing chart of its operation, respectively. In FIG. 1A, two input terminals of two select switches (CKvin and CKvref) are coupled to an input voltage Vin and a reference voltage Vref, and both output terminals are coupled to one terminal of a capacitor C1; two inverters A1 and A2 are connected with two switches az1 and az2 in parallel, respectively, and the other terminal of the capacitor C1 is coupled to the input terminal of the inverter A1; a capacitor C2 is provided between the output terminal of the inverter A1 and the input terminal of the inverter A2; and the output terminal of the inverter A2 is coupled to the input terminal of the inverter A3. The operation of the comparator depicted in FIG. 1 will be described as follows in accompaniment with FIG. 1B, FIG. 2A, and FIG. 2B.

In time interval (1), since the switches az1, az2, and the select switch CKvin are turned on, and the select switch CKvref is turned off, the circuit topology of the comparator is depicted as FIG. 2A. The voltage levels at P1~P4 are the threshold voltage Vth of the inverters, because the input and output terminals of the inverters (A1 and A2) are connected together. The voltage level at P0 is Vin, and therefore the voltages stored in capacitors C1 and C2 are (Vth−Vin) and 0, respectively. The comparator carries out the operation to take samples of the input voltage Vin.

In time interval (2), since only the select switch CKvref is turned on, and the switches az1, az2, and the select switch CKvin are turned off, the circuit topology of the comparator is depicted as FIG. 2B. The voltage at P0 is Vref and the capacitor C1 stores the voltage of (Vth−Vin), and thus the voltage at P1 becomes Vth−(Vin−Vref). The voltage at P1 is amplified by the inverter A1 and outputted to P2. The voltage at P2 can be represented as Vth+(Vin−Vref)×M, wherein M is the gain of the inverters. The voltage stored in capacitor C2 is 0, and thus the voltage at P3 is equal to that at P2. The voltage at P3 is amplified by the inverter A2, and the voltage at P4 can be represented as Vth−(Vin−Vref)×M². Finally, the inverter A3 amplifies the voltage at P4 and outputs the comparing result Vout which equals Vth+(Vin−Vref) ×M³. From above descriptions, when the comparing signal (Vin−Vref) is small, a longer time is required for reaching an output of steady state during the amplifying operation of every inverter, thereby limiting the operating speed of the comparator.

SUMMARY OF THE INVENTION

Therefore, an object of the present invention is to provide a speed-enhancing comparator to eliminate the limitation on converting speed. The comparator according to the present invention uses the same number of inverters as that used by a conventional comparator, but it has greater gain than that of the conventional comparator so that the output voltage can reach its steady state as soon as possible, thereby reducing the comparing time and enhancing the converting speed of the comparator.

The present invention achieves the above-indicated objects by providing a comparator which comprises: a first capacitor, a first inverter, and a first switch, wherein the first switch and the first inverter are connected in parallel, and a first terminal of the first capacitor is coupled to an input terminal of the first inverter; a first input switch and a second input switch, wherein input terminals of the first and second input switches are coupled to an input voltage and a reference voltage respectively, and both output terminals of the first and second input switches are coupled to a second terminal of the first capacitor; a second inverter, a second switch, and a third switch, wherein the second inverter and the third switch are connected in series and then connected in parallel with the second switch, and an output terminal of the first inverter is coupled to an input terminal of the second inverter; and a second capacitor, a third inverter, and a fourth switch, wherein the fourth switch and third inverter are connected in parallel, and a first terminal of the second capacitor is coupled to an input terminal of the third inverter, and a second terminal of the second capacitor is coupled to both output terminals of the second and third switches. The first to fourth switches and the first and second input switches carry out on/off operations whereby the third inverter outputs a comparing result of the input voltage and the reference voltage.

The operation timing of the present invention is described as follows. (1) First, when the first input switch and the first switch are turned on, and the second input switch and the second, third and fourth switches are turned off, the comparator takes samples of the input voltage. (2) Next, when the second input switch and the second and fourth switches are turned on, and the first input switch and the first and third switches are turned off, the first inverter compares the input voltage with the reference voltage and outputs a first comparing voltage. (3) Finally, when the third switch and the second input switch are turned on, and the first input switch and the first, second and fourth switches are turned off, the second inverter amplifies the first comparing voltage and outputs a second comparing voltage, and the third inverter amplifies the sum of the first and second comparing voltages thereby obtaining the comparing result.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE PREFERRED EMBODIMENTS

Figure 1A:
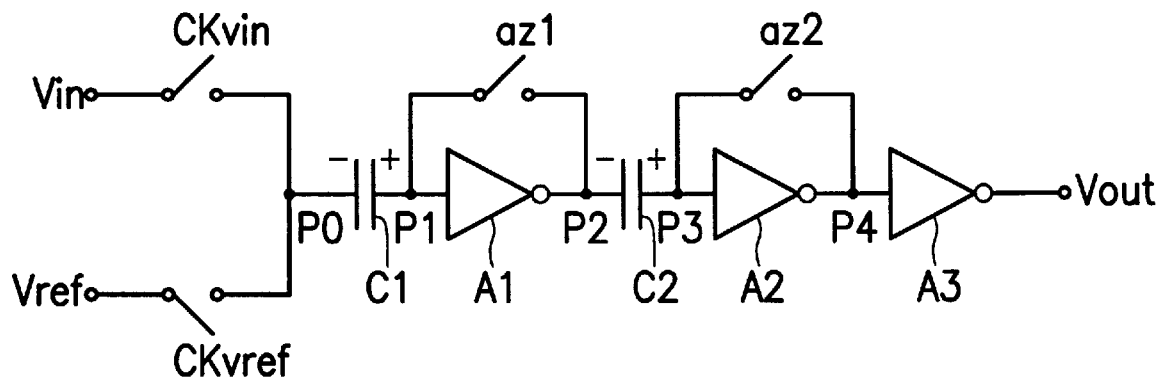
FIG. 1A and FIG. 1B illustrate the structure of a conventional comparator and the timing chart of its operation, respectively.
Figure 1B:
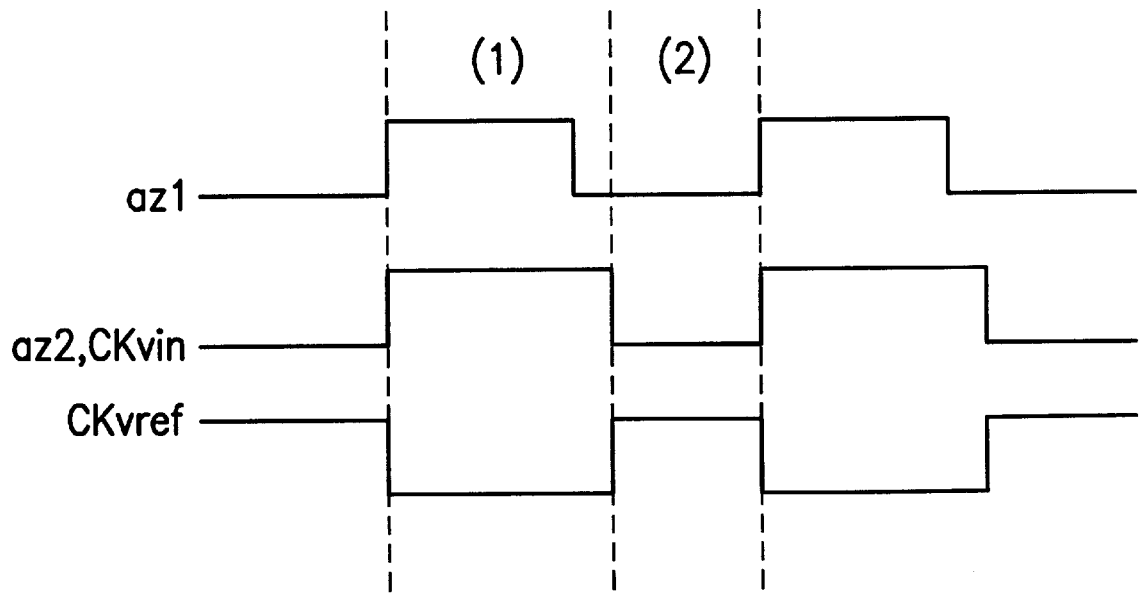
Figure 2A:
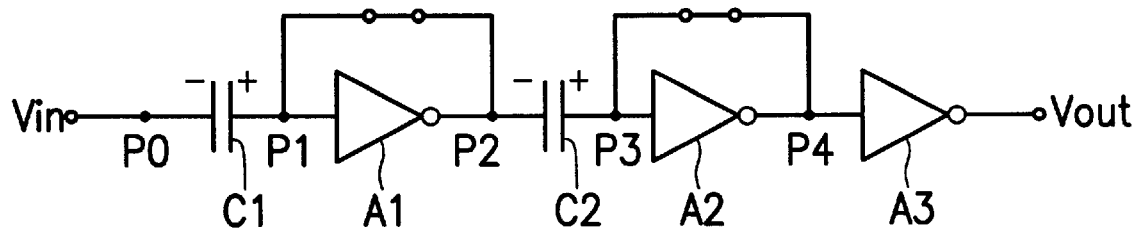
FIG. 2A and FIG. 2B illustrate various circuit topologies of the comparator depicted in FIG. 1A during different time intervals.
Figure 2B:
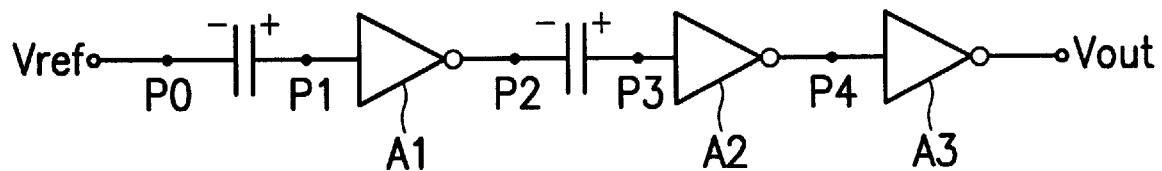
Figure 3A:
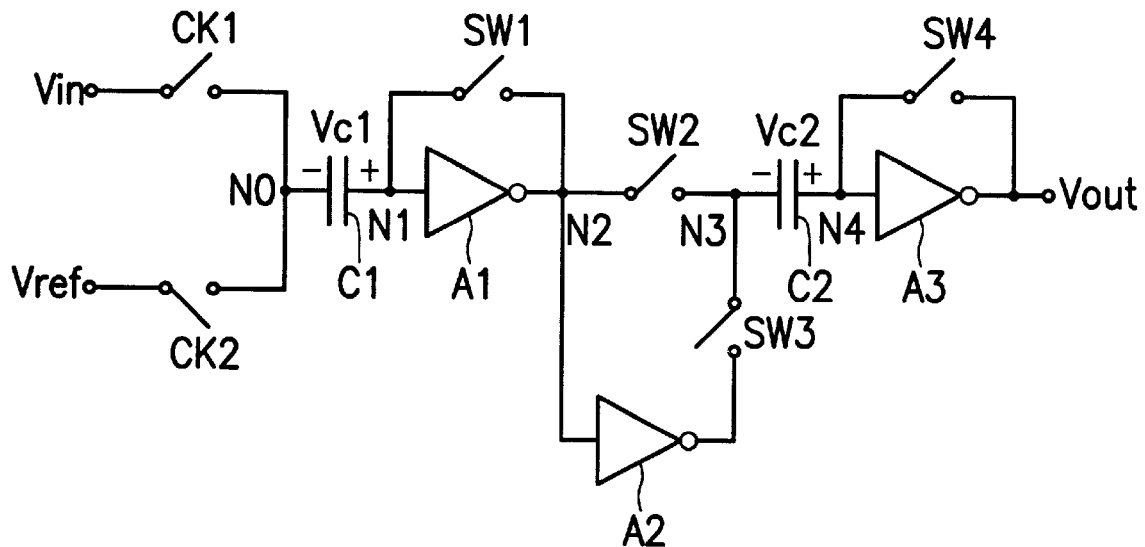
FIG. 3A and FIG. 3B illustrate a structure of a comparator according to the present invention and the timing chart of its operation, respectively.
Figure 3B:
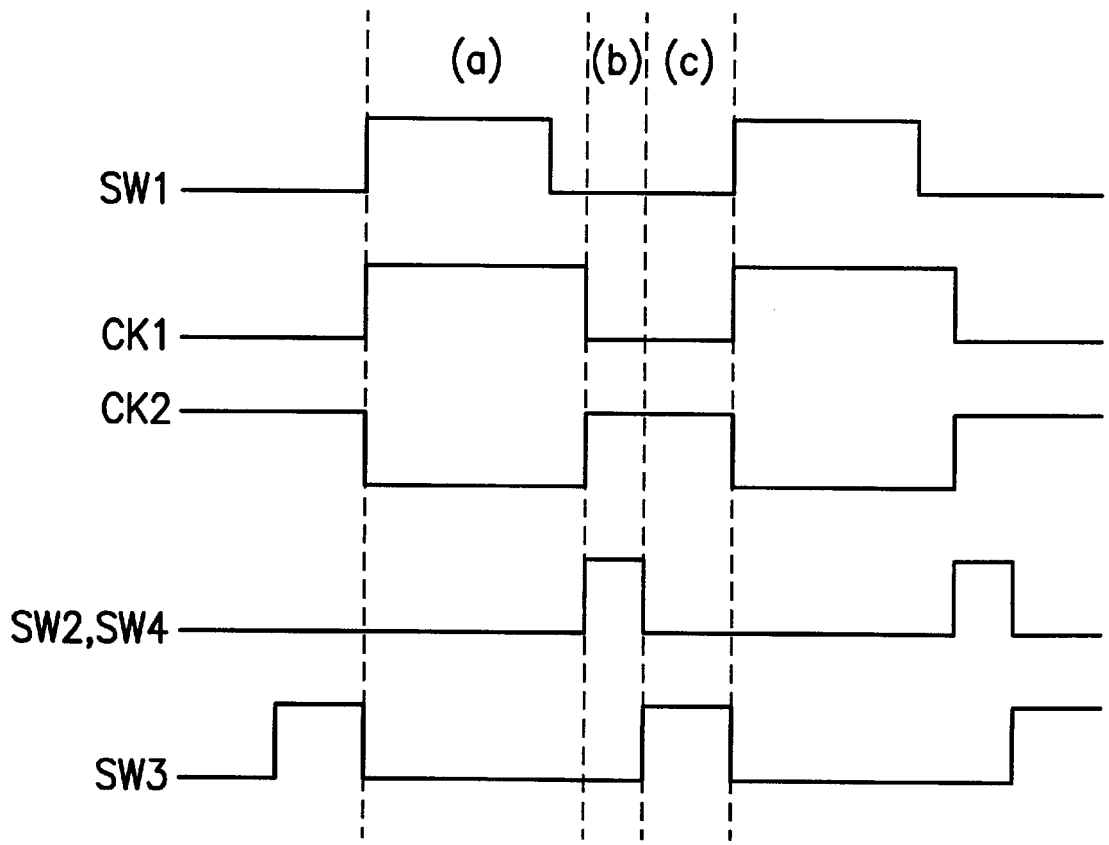

FIG. 3A and FIG. 3B illustrate a structure of a comparator according to the present invention and the timing chart of its operation, respectively. Referring to FIG. 3A, the structure of the comparator according to the present invention is described as follows.

In FIG. 3A, a first switch SW1 and a first inverter A1 are connected in parallel, and one terminal (node N1) of a first capacitor C1 is coupled to the input terminal of the first inverter A1.

Input terminals of a first input switch CK1 and a second input switch CK2 are coupled to an input voltage Vin and a reference voltage Vref respectively, and both output terminals of the first and second input switches CK1 and CK2 are coupled to the other terminal (node N2) of the first capacitor C1.

A second inverter A2 and a third switch SW3 are connected in series first, and then they are connected in parallel with the second switch SW2. The output terminal of the first inverter A1 is coupled to the input terminal (node N2) of the second inverter A2.

A fourth switch SW4 and the third inverter A3 are connected in parallel. One terminal (node N4) of a second capacitor C2 is coupled to an input terminal of the third inverter A3, and the other terminal (node N3) of the second capacitor C2 is coupled to both output terminals of the second and third switches (SW2, SW3).

The first to fourth switches (SW1~SW4) and the first and second input switches (CK1, CK2) carry out on/off operations, whereby the third inverter A3 outputs a comparing result Vout of the input voltage Vin and the reference voltage Vref. The operation of the comparator depicted in FIG. 3A will be described as follows in accompaniment with FIG. 3B, and FIG. 4A to FIG. 4C. In this embodiment, all the inverters have same gains and threshold voltages.

Figure 4A:
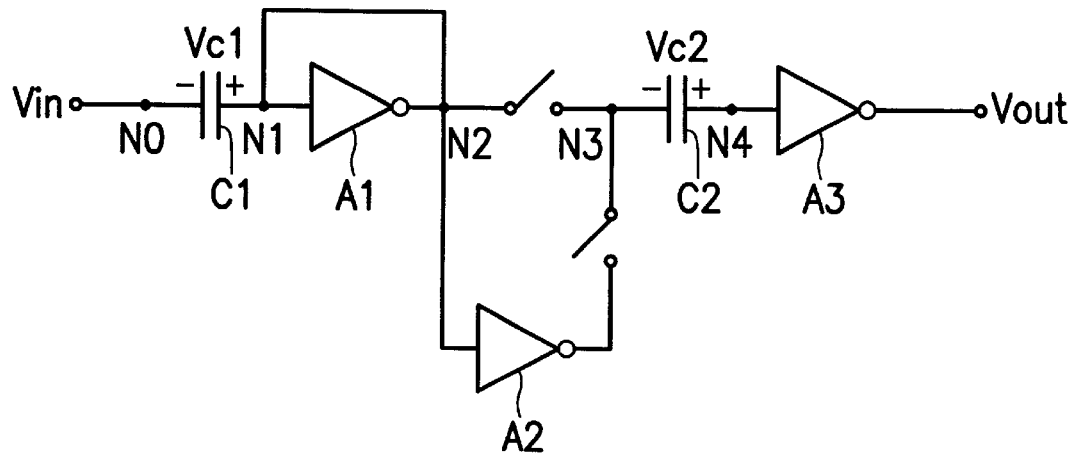
FIG. 4A to FIG. 4C illustrate various circuit topologies of the comparator depicted in FIG. 3A during different time intervals.

In time interval (a), when the first input switch CK1 and the first switch SW1 are turned on, and the second input switch CK2 and the second to fourth switches (SW2~SW4) are turned off, the circuit topology of the comparator is depicted in FIG. 4A. Both input and output terminals of the first inverter A1 are connected together, and therefore the voltages at node N1 and N2 equal the threshold voltage (Vth) of the first inverter A1. The voltage at node N0 is Vin, and the voltage (Vc1) stored in the first capacitor C1 is Vth−Vin, whereby the comparator takes samples of the input voltage Vin.

Figure 4B:
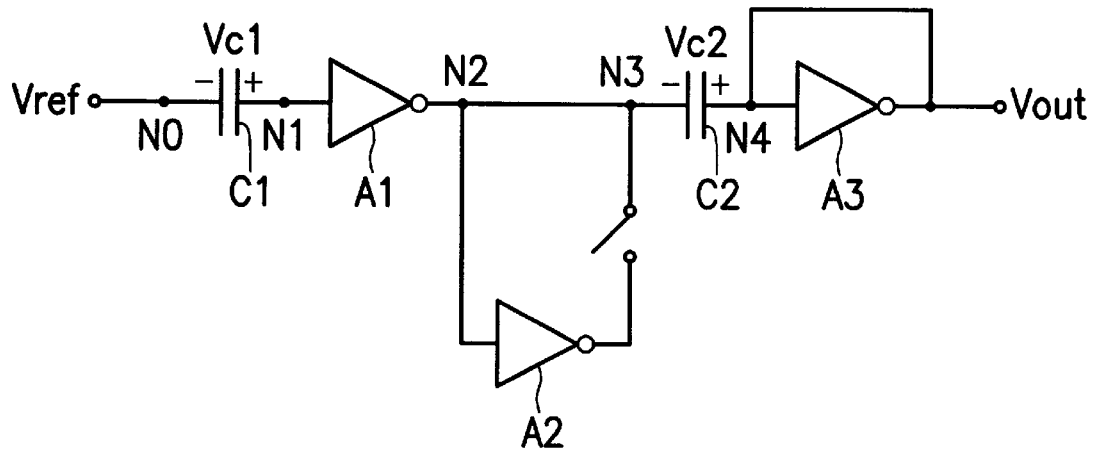

In time interval (b), while the second input switch CK2 and the second and fourth switches (SW2, SW4) are turned on, and the first input switch CK1 and the first and third switches (SW1, SW3) are turned off, the circuit topology of the comparator is depicted in FIG. 4B. The voltage at node N0 is Vref and the first capacitor C1 keeps voltage of (Vth−Vin), and therefore the voltage at node N1 becomes Vth−(Vin−Vref). Next, the first inverter A1 amplifies the voltage at node N1 and outputs the voltage of Vth+(Vin−Vref)×M at nodes N2 and N3, wherein M is the gain of the inverters A1. Both output and input terminals of the third inverter A3 are connected together, and thus the voltage at node N4 and Vout equal the threshold voltage (Vth) of the third inverter A3. Consequently, the voltage (Vc2) stored in the second capacitor C2 is −(Vin−Vref)×M.

Figure 4C:
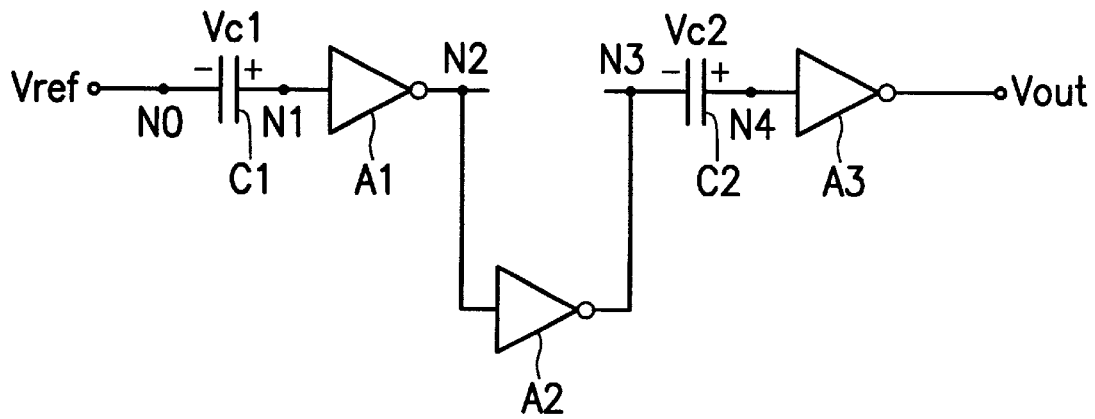

In time interval (c), while the third switch SW3 and the second input switch CK2 are turned on, and the first input switch CK1 and the first, second and fourth switches (SW1, SW2, SW4) are turned off, the circuit topology of the comparator is depicted in FIG. 4C. Since the voltage at node N0 is still Vref, the voltage at nodes N2 is Vth+(Vin−Vref)×M. The second inverter A2 amplifies the voltage at node N2 and outputs a voltage to node N3, and therefore the voltage at node N3 becomes Vth−(Vin−Vref)×M². Because the voltage Vc2 is stored in the second capacitor C2 in time interval (b), the voltage at node N4 will be enhanced to the voltage of Vth−(Vin−Vref)×M²+Vc2 (that is, Vth−(Vin−Vref)×(M²+M)) in time interval (c). Finally, the third inverter A3 amplifies the voltage at node N4 and outputs the voltage Vout of Vth−(Vin−Vref)×(M³+M²).

The comparator according to the present invention comprises three inverters and outputs the comparing voltage of Vth−(Vin−Vref)×(M³+M²) which is greater than the comparing voltage of Vth−(Vin−Vref)×M³ outputted by the conventional comparator, which also comprises three inverters. Therefore, the voltage gain of the present invention is greater than that of the conventional comparator.

In the present invention, the second inverter works in association with the second and third switches such that an additional voltage of Vth−(Vin−Vref)×M² is added to the input terminal of the third inverter during the amplifying process, thereby making the voltage at the input terminal of the last amplifying stage (the third inverter) equal to Vth−(Vin−Vref)×(M²+M). However, in a conventional comparator, the intermediate voltage at the input terminal of the last amplifying stage (the third inverter) amounts to only Vth−(Vin−Vref)×M². Consequently, the amount of time required for the intermediate voltage (or output voltage) to reach its steady state for a comparator according to the present invention is less than that required for a conventional comparator during the same operating time interval. Therefore, the present invention can make its output voltage reach its steady state faster, thereby improving the converting speed.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A comparator comprising:

a first capacitor, a first inverter, and a first switch, wherein said first switch and said first inverter are connected in parallel, and a first terminal of said first capacitor is coupled to an input terminal of said first inverter;

a first input switch and a second input switch, wherein input terminals of said first and second input switches are coupled to an input voltage and a reference voltage respectively, and both output terminals of said first and second input switches are coupled to a second terminal of said first capacitor;

a second inverter, a second switch, and a third switch, wherein said second inverter and said third switch are connected in series and then connected in parallel with said second switch, and an output terminal of said first inverter is coupled to an input terminal of said second inverter; and a second capacitor, a third inverter, and a fourth switch, wherein said fourth switch and third inverter are connected in parallel, and a first terminal of said second capacitor is coupled to an input terminal of said third inverter, and a second terminal of said second capacitor is coupled to both output terminals of said second and third switches;

said first to fourth switches and said first and second input switches carry out on/off operations whereby said third inverter outputs a comparing result of said input voltage and said reference voltage.

2. The comparator as claimed in claim 1, wherein when said first input switch and said first switch are turned on, and said second input switch and said second to fourth switches are turned off, said comparator takes samples of said input voltage;

when said second input switch and said second and fourth switches are turned on, and said first input switch and said first and third switches are turned off, said first inverter compares said input voltage with said reference voltage and outputs a first comparing voltage; and when said third switch and said second input switch are turned on, and said first input switch and said first, second and fourth switches are turned off, said second inverter amplifies said first comparing voltage and outputs a second comparing voltage, and said third inverter amplifies the sum of said first and second comparing voltages, thereby obtaining said comparing result.

* * * * *

UNITED STATES PATENT AND TRADEMARK OFFICE
CERTIFICATE OF CORRECTION

PATENT NO. : 5,973,517
DATED : 10/26/99
INVENTOR(S) : Kao

It is certified that error appears in the above-identified patent and that said Letters Patent is hereby corrected as shown below:

Column 1, line 14, change "converters, ADC hereinafter," to --converters ("ADC" hereinafter ")".

Column 2, line 66, after "on" delete ",".

Column 3, line 3, after "on" delete ", and".

Column 3, line 7, after "on" delete ",".

Column 4, line 4, after "on" delete ", and".

Column 4, line 16, after "on" delete ",".

Column 4, line 30, after "on" delete ",".

Signed and Sealed this

Twenty-ninth Day of August, 2000

Attest:

Q. TODD DICKINSON

*Attesting Officer*　　　*Director of Patents and Trademarks*